United States Patent [19]

Book et al.

[11] Patent Number: 5,597,423
[45] Date of Patent: Jan. 28, 1997

[54] NIOBIUM TIN SHEET FOR SUPERCONDUCTING MAGNETS

[75] Inventors: John E. Book, Effingham; Delton A. Grey, Jr.; Christopher G. King, both of Florence; Antony Mantone, Effingham, all of S.C.

[73] Assignee: General Electric Company, Milwaukee, Wis.

[21] Appl. No.: 575,299

[22] Filed: Dec. 20, 1995

[51] Int. Cl.⁶ .................................................. B05D 1/18
[52] U.S. Cl. ................................................ 148/98; 427/62
[58] Field of Search .......................... 427/62; 148/538, 148/98

[56] References Cited

U.S. PATENT DOCUMENTS 3,317,286  5/1967  Sorbo ........................................ 427/62
5,472,936  12/1995  Benz ......................................... 148/98

*Primary Examiner*—Sam Silverberg
*Attorney, Agent, or Firm*—Irving M. Freedman; John H. Pilarski

[57] ABSTRACT

A method to provide large sheets of $Nb_3Sn$ superconducting material suitable for use as a superconducting gradient shield in a magnetic resonance imaging system magnet by heating an anodized Nb-1 Zr sheet, tin dipping and reacting the sheet, and subsequently quenching the sheet in a purged atmosphere to provide an improved time constant and lowered Jc heating when used in a superconducting magnetic field.

17 Claims, 3 Drawing Sheets

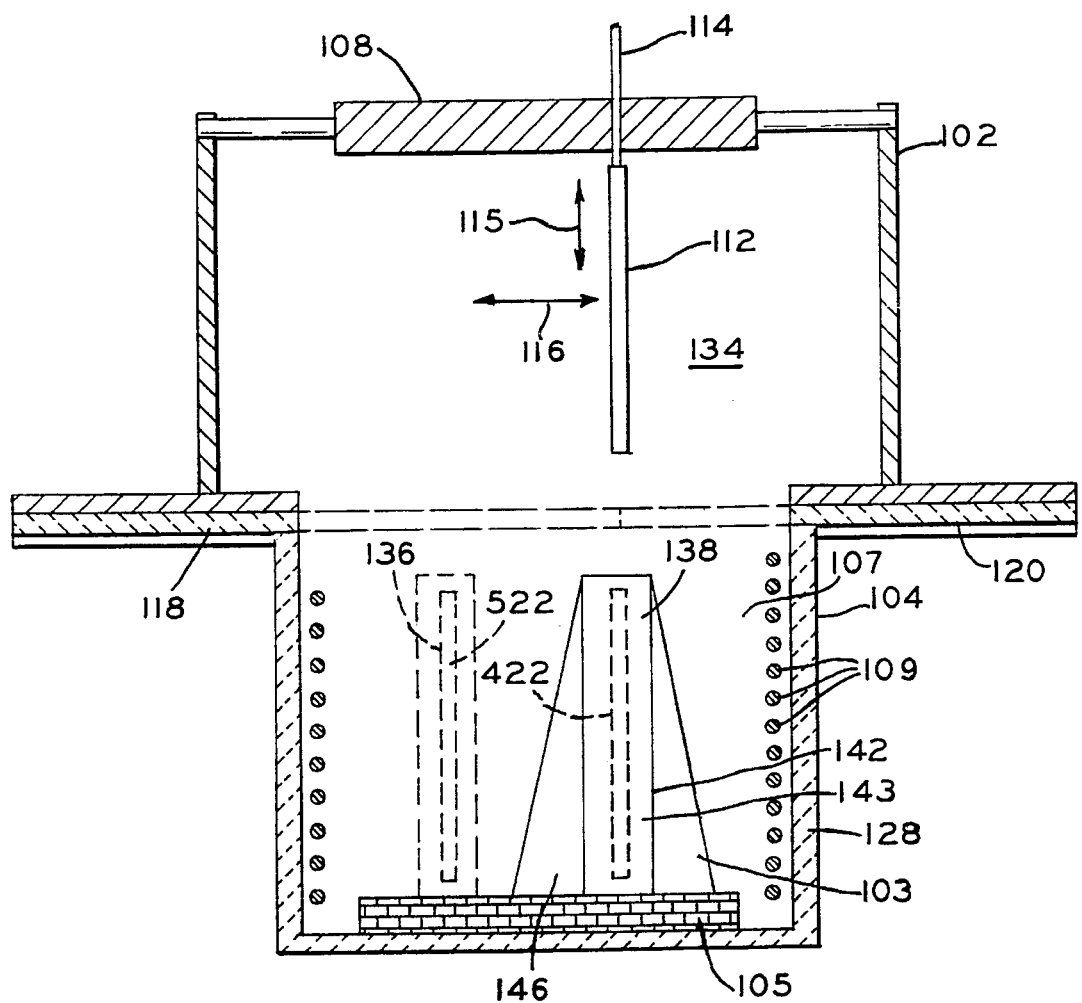
FIG_2

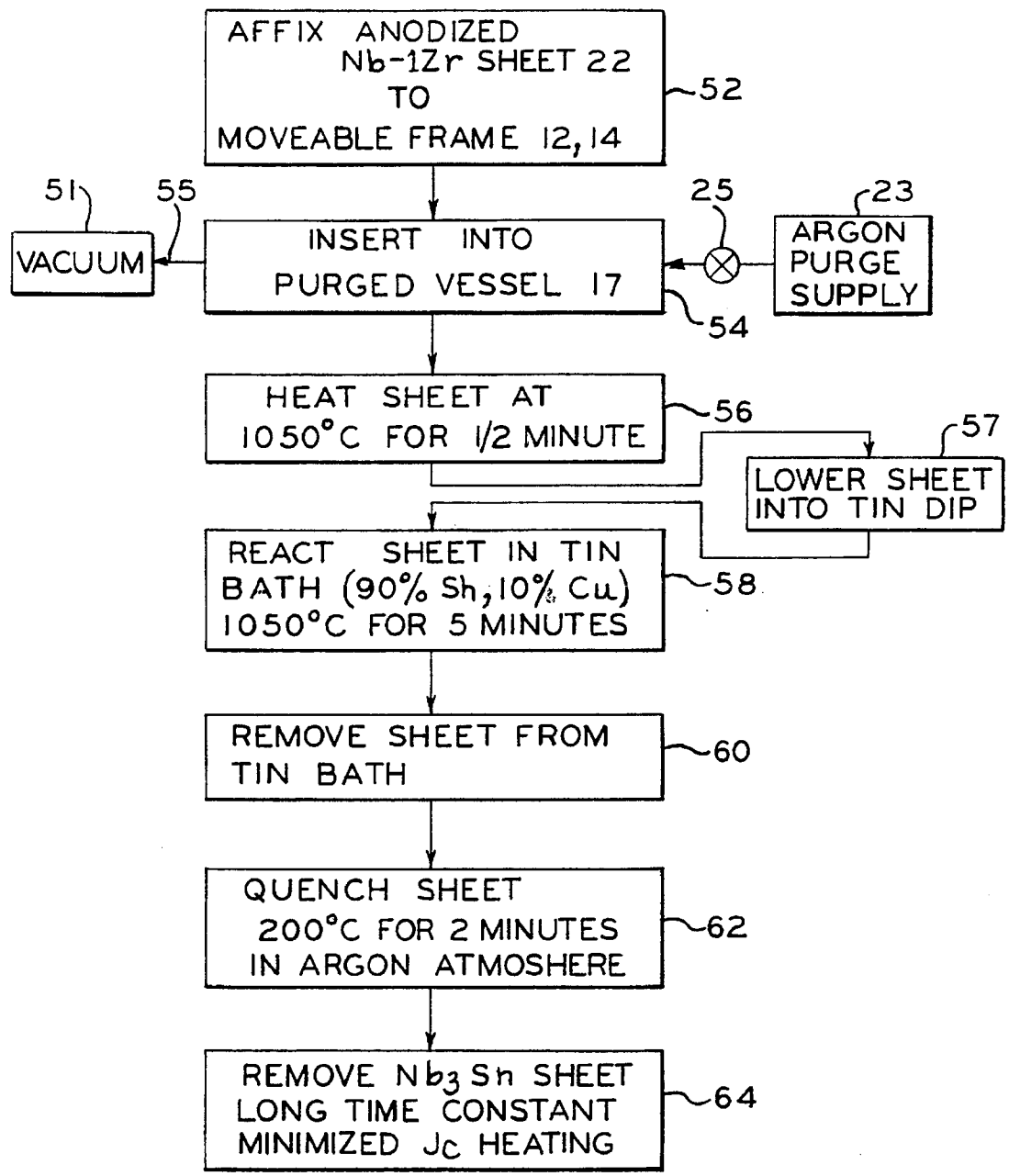
FIG_3

NIOBIUM TIN SHEET FOR SUPERCONDUCTING MAGNETS

BACKGROUND OF INVENTION

The present invention relates to the formation of relatively large sheets of niobium tin or $Nb_3Sn$ for use in superconducting magnets.

It is known to use superconducting cylindrical shields as a superconducting gradient shield in magnetic resonance imaging magnet coils. Such shields shield the magnetic fields resulting from pulsing of the imaging coils from interfering with the magnetic fields produced by the main magnet superconducting coils. Copending patent application by Bu-Xin Xu et al., Ser. No. 08/236,060, filed May 2, 1994, entitled "Superconducting Gradient Coil Shields in Magnetic Resonance Imaging Magnets" and assigned to the same assignee as the subject patent application, which patent application is hereby incorporated by reference provides a detailed description and understanding of the fabrication and use of superconducting sheets of relatively large size in a superconducting gradient shield for magnetic resonance imaging and the magnetic characteristics needed for such applications. However, superconducting materials are not commercially available in large sheets for use in forming a relatively large diameter superconducting gradient shield (hereinafter "SGS"). SGS utilize cylinders whose diameter may be in the order of 1 meter and whose length may be in the order of 3 meters.

While it is known to fabricate SGS out of $Nb_3Sn$ and NbTi, the fabrication and resulting superconducting magnetic characteristics have proven to be less than completely satisfactory. $Nb_3Sn$ reacted foil wound radially over a transverse layer or cylinder is found to shield quite well and have a minimized heating during magnetic resonance imaging (hereinafter "MRI") but provides a time constant which is less than desirable. On the other hand, NbTi sheet provides an acceptable time constant due to the sheet's geometry but exhibits a heating which is higher than desirable during MRI imaging due to a critical current density, JC, of $1.75 \times 10^{-9}$ $A/m^2$ at 4K and 2T in NbTi that is lower than that resulting from use of $Nb_3Sn$. Such heating is highly undesirable since it increases the rate of helium boiloff in an MRI helium cooled superconducting magnet.

However, $Nb_3Sn$ exhibits a brittleness which makes it difficult to fabricate in large sheets, necessitating welding multiple sheets together, with the sheets being difficult to fabricate into the large cylinders required for SGS in superconducting magnets used in MRI applications. As a result, it has been recognized for some time that it would be desirable to have a material providing a combination of a long time construct, minimum heating during operation and ease of handling in the fabrication of relatively large SGS cylinders for MRI applications. Considerable research has been directed at obtaining such a material.

OBJECTS AND SUMMARY OF INVENTION

It is an object of the present invention to provide sheets of superconducting material which may be readily fabricated for use as SGS in superconducting magnets for MRI applications.

It is another object of the present invention to provide a new and improved superconducting sheet material which exhibits a long time constant and minimized heating when used as a superconducting gradient shield in superconducting magnets for MRI operations.

It is a further object of the present invention to provide improved superconducting sheet material suitable for commercial production of shields used in superconducting magnets.

In accordance with one form of the present invention, improved sheet material suitable for formation into large cylinders for use in superconducting magnets is fabricated by anodizing sheets of niobium, then heating the sheets for a short period of time for decomposition of the oxygen, followed by tin dipping and reacting of the heated sheet for a much longer period of time in a bath of molten tin to form the $Nb_3Sn$. The tin dipped niobium sheet is subsequently quenched at a temperature considerably lower than that used in dipping the sheet.

More particularly, a niobium sheet is initially heated for a short period of time such as one half minute to a temperature approx. 1050° C., and then dipped in a molten bath of a tin copper alloy, 90 parts tin to 10 parts copper by weight, for approximately three to five minutes; followed by quenching the tin-dipped sheet at a heated but considerably lower temperature of less than 200° C. for approximately two minutes.

This results in a fine grain size in the resultant $Nb_3Sn$ layer which yields a higher Jc in the material than conventionally processed NbTi, and which in turn lowers heating during superconducting operation, and provides sheet material with a relatively long time constant.

BRIEF DESCRIPTION OF DRAWINGS

FIG. 2 is an alternate embodiment of FIG. 1 enabling a reduction in the size of the fabrication equipment used in the present invention.

FIG. 3 is a flow diagram in block form useful in illustrating the present invention.

DETAILED DESCRIPTION OF PREFERRED EMBODIMENT OF INVENTION

Figure 1:
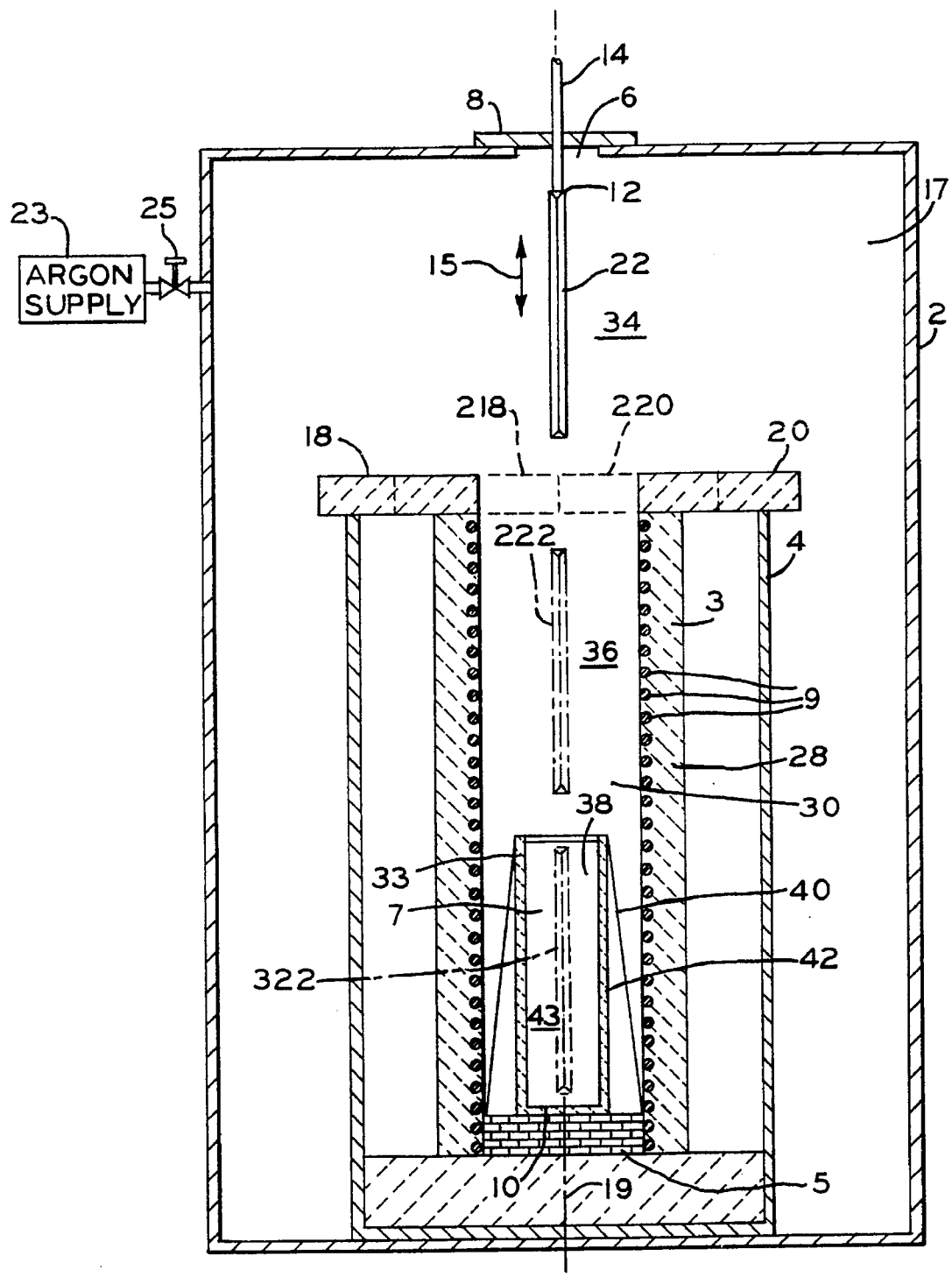
FIG. 1 is a simplified cross section showing a method of forming superconducting sheets by the present invention.

Referring first to FIG. 1, outer vessel 2 surrounds heated inner vessel 4 which includes a central cylinder 3 supporting heating coil 9 which provides indirect heating to central cavity or chamber 30 within the cylindrical heater and inner vessel 4.

Inner chamber 7 of crucible 33 within central chamber 30 is formed by walls 42 and bottom member 10 resting on insulating material 5 which may be formed of any appropriate and stable material such as refractory brick.

An opening 6 is provided at the top of outer vessel 2 with positive pressure feed through seal 8 covering the opening. A molydenum frame 12 supported by feed through hanger rod 14 is vertically moveable in the direction indicated by arrow 15 along center axis 19 of central chamber 30 to enable the vertical movement of Nb-1Zr sheet 22 attached to frame 12 within region 17, the interior of outer vessel 2 and also into inner chamber 7. A guillotine-type knife gate 18,20 is selectively openable to allow the insertion of frame 12 and sheet 22 into central chamber 30 after which it may be pneumatically selectively closed against feed through hanger rod 14 when the frame and sheet are in position 36 and in the tin dip bath 43 within the heated central chamber.

Crucible 33 rests on bottom 5 of central chamber 30 and contains a tin alloy which is 90 parts tin and 10 parts copper by weight is melted by heater 9 positioned on walls 28 surrounding the crucible.

Referring next to FIGS. 1 and 3, in utilizing the apparatus shown in FIG. 1, Nb-1Zr sheet of relatively large size, such as 36 inches wide by 144 inches long by 0.005 inches thick, is affixed 52 to frame 12 at the end regions (not shown) of the sheet and is lowered or inserted 54 by feed through hanger rod 14 through positive pressure feed through seal 8 after heating coil 9 has raised the temperature of central chamber 30 to provide a molten tin bath 43 comprising 90% tin and 10% copper by weight with the temperature of the tin bath being maintained at approximately 1050° C., and that of the quench region 17 within outer vessel 2 being less than approximately 200° C.

Quench region 17 within outer vessel 2 is purged 55 of oxygen by vacuum 51 and filled with argon from argon supply tank 23 connected to the interior of outer vessel 2 through control valve 25.

The interior of quench region 17 of outer vessel 2 is indirectly heated to a temperature less than 200° C. by heat provided by heating coil 9. Sheet 22 is lowered on frame 12 by downward movement of feed through hanger rod 14 in the direction of arrow 15 to be inserted 54 to a first position 34 within quench region 17 above inner vessel 4 where it is heated 56 in a non-oxidizing argon atmosphere at a temperature of less than approximately 200° C. for a half minute.

Sheet 22 is then lowered 57 on its support arrangement 12,14 to a second position shown dotted as 36 within central chamber 30 where the sheet identified as 222 is heated at approximately 1050° C. for one-half minute during which knife gate 18,20 is closed to the position shown dotted as 218,220 around feed through hanger 14.

Sheet 222 on its hanger assembly 12,14 is then lowered into molten tin bath 43 as shown dotted in position 38 where the sheet identified as 322 is tin dipped and reacted 58 in a molten tin bath comprising 90 parts tin to 10 parts copper by weight within crucible 42 at a temperature of 1050° C. for 5 minutes. The sheet is then removed 60 from tin bath 43 within crucible 42 and moved vertically upwards back to position 34 within purge or quench region 17 for a quench 62 period of less than 2 minutes where sheet 22 is cooled to less than 200° C. in an argon atmosphere provided by argon supply 23.

Sheet 22 is then retracted on its frame 12 through positive feed through seal 8 to the outside of outer vessel 2 where it may be removed from frame 12 for use in fabricating superconducting gradient shields of the general type shown, for example, in the aforementioned copending U.S. Patent application.

FIG. 2 is an alternate embodiment of FIG. 1 useful in reducing the size and axial length of central cylinder 3 by in essence performing the heating of the tin sheet in the region beside molten tin bath 43 rather than above it as is accomplished in FIG. 1. This reduces the height of inner chamber 7, the height of the overall equipment and the height of heating coil 9. The numerals in FIG. 2 correspond to the numerals of FIG. 1 plus 100, that is heating coil 9 of FIG. 1 is 109 in FIG. 2.

Referring to FIG. 2, horizontal movement indicated by arrow 116 in a direction perpendicular to vertical movement indicated by arrow 115 is provided to frame 112 (and sheet 22) by a slot in moveable feed through seal 108 such that the Nb-1Zr sheet may be positioned either in position 522 adjacent to crucible 142 or at position 422 within the molten tin bath 143 inside crucible 142. This requires, of course, that guillotine-type knife gate 118,120 be closable around feed through rod hanger 114 when it is positioned above position 422 or above position 522. It is noted that sheet 422, 522 is supported on frame 112 such that both sides of the sheet are simultaneously exposed to the heating, tin dipping reaction and quenching steps.

By way of summary and for a better understanding of the sequence of steps involved in the subject invention, reference may also be had to FIG. 3.

Referring to FIG. 3 in addition to FIGS. 1 and 2, a large Nb-1Zr sheet is affixed 52 to a moveable frame 12,14 and moved into position 34 which is purged of oxygen by argon purge supply 23 controlled by control valve 25. After approximately one half minute it is moved to a second position 36 where it is heated 56 at 1050° C. for one-half minute followed by being lowered 57 into tin bath 43 of 90 parts tin to 10 parts copper at a temperature of 1050° C. for approximately three to five minutes at third position 38 to react with the tin bath, after which it is removed 60 from the tin bath and is quenched 62 in the argon atmosphere for less than two minutes at a temperature of less than 200° C. Sheet 22 is then removed 64 from vessel 2 and verified, if necessary by testing, that it exhibits a desirable long time constant with minimized Jc heating. Since both sides of sheet 22 are exposed within frame 12, 14 both sides are subjected at the same time to each of the steps of the subject invention, an $Nb_3Sn$ layer is formed on both sides of the sheet.

Inspection of the results of utilizing the present invention indicates that the resultant reaction layer of $Nb_3Sn$ exhibited a fine grain size with ample layer thickness. Thickness of the layer and fineness of the grain was measured and verified through use of a scanning electron microscope and comparison of the subject invention with $Nb_3Sn$ produced by other continuous methods such as anodize, decomp, dipping in unsaturated tin, and decomp in which SnCu is not saturated with niobium indicated that the subject invention provided a $Nb_3Sn$ layer with a small grain size needed for a high Jc during operation. The grain size after being immersed 57 in tin bath 43 for three minutes measured 0.2 to 0.3 microns with the $Nb_3Sn$ layer on sheet 22 being 5–7 microns thick. When immersed 57 for five minutes, the grain size was 0.5 to 0.7 microns with the $Nb_3Sn$ layer being 7–9 microns thick. The variations in the resultant layers can be used to select a desired layer having a high enough Jc for the particular MRI application and current capacity since the lower Jc provides a higher current capacity if that is desirable for the particular application. In addition, the time constant of the resultant layered sheet is suitable and is longer than that which $Nb_3Sn$ sheet would otherwise provide.

While the present invention has been described with respect to certain preferred embodiments thereof, it is to be understood that numerous variations and details of construction, the arrangement and combination of parts, and the types of materials used may be made without departing from the spirit and scope of the invention.

We claim:

1. A method of forming small grain $Nb_3Sn$ layer on NbTi sheet suitable for superconducting shields for superconducting magnets with minimized Jc heating during superconducting operation comprising:

heating anodized Nb-1Zr niobium sheet for a short period of time at a temperature of approximately 1050° C.;

tin dipping and reacting said heated niobium sheet in a bath of molten tin for a much longer period of time approximately 10 times the shorter period at approximately the same temperature as the heating of the sheet to provide an $Nb_3Sn$ layer on the sheet; and quenching the tin dipped sheet at a temperature of less than approximately 200° C. for less than approximately 2 minutes.

2. The method of claim 1 wherein said short period of time is approximately one half minute.

3. The method of claim 1 wherein said much longer period of time is selected to be approximately 5–7 minutes to control the grain size and thickness of said $Nb_3Sn$ layer.

4. A method of forming small grain $Nb_3Sn$ layer on NbTi sheet suitable for superconducting shields for superconducting magnets with minimized Jc heating during superconducting operation comprising:

heating anodized Nb-1Zr niobium sheet for a short period of time at a temperature of approximately 1050° C.;

tin dipping and reacting said heated niobium sheet in a bath of molten tin for a much longer period of time approximately 10 times the shorter period at approximately the same temperature as the heating of the sheet to provide an $Nb_3Sn$ layer on the sheet; and quenching the tin dipped sheet at a considerable lower temperature for a period of time intermediate said short period and said much longer period;

wherein said much longer period of time is selected to be approximately 5–7 minutes to control the grain size and thickness of said $Nb_3Sn$ layer; and wherein said periods of time are selected to provide a desired $Nb_3Sn$ grain size in the range of 0.2–0.7 microns and $Nb_3Sn$ layer thickness of 5–9 microns.

5. The method of claim 4 wherein said tin provided to the tin bath includes approximately 90 parts tin to 10 parts copper by weight.

6. The method of claim 5 wherein an argon source is provided and said quench is in an argon atmosphere from said argon source.

7. The method of claim 5 wherein said niobium sheet is affixed to a frame to maintain flatness during the process.

8. The method of claim 5 wherein said frame is moveable in a vertical direction to enable said heating of said sheet, and subsequently lowering said niobium sheet into a tin dip bath for said tin dipping and reacting, and then raising said niobium sheet from said bath for said quenching.

9. The method of claim 8 wherein means are provided to heat a first chamber including said bath, and an adjacent area outside said bath in which to position said sheet for said heating step.

10. The method of claim 9 wherein a second chamber is positioned above said first chamber, and maintaining an oxygen purged atmosphere within said second chamber, said quenching being accomplished while said sheet is outside said first chamber and within said second chamber.

11. The method of claim 10 wherein said frame is suspended from a hanger and said second chamber includes a positive pressure seal which is selectively opened to admit said frame and sheet and subsequently closed around said frame hanger to maintain said purged atmosphere.

12. The method of claim 11 wherein said purged atmosphere is provided by argon and heating said purged atmosphere to a temperature of less than approximately 200° C.

13. The method of claim 12 wherein a moveable guillotine-type knife gate is provided to close said first chamber, and a moveable hanger supports said frame including the additional step of selectively closing said knife gate around said hanger after said niobium sheet is positioned within said first chamber.

14. The method of claim 13 wherein the positioning of said knife gate is moveable to enable selective movement of said sheet in orthogonal directions to at least two different positions within said first chamber.

15. The method of claim 14 wherein said at least two different positions includes positions selected frown the positions above and beside said tin bath.

16. The method of claim 15 wherein the heating means heats said first chamber including said at least two different positions and wherein a vacuum is applied in purging.

17. The method of claim 16 wherein said frame exposes both sides of said sheet such that said both sides are subjected at the same time to each of the steps of said method.

* * * * *